United States Patent [19]

Zapp et al.

[11] 4,369,416

[45] Jan. 18, 1983

[54] BAND-STOP FILTER FOR EQUIPMENT WITH CARRIER-FREQUENCY UTILIZATION OF LOW-VOLTAGE LINES

[75] Inventors: Robert Zapp, Schalksmühle; Ewald Wichmann, Lüdenscheid, both of Fed. Rep. of Germany

[73] Assignee: Brown, Boveri & Cie AG, Mannheim, Fed. Rep. of Germany

[21] Appl. No.: 218,499

[22] Filed: Dec. 22, 1980

[30] Foreign Application Priority Data

Dec. 22, 1979 [DE] Fed. Rep. of Germany ....... 2952036
Jan. 25, 1980 [DE] Fed. Rep. of Germany ....... 3002637

[51] Int. Cl.³ .......................... H03H 7/01; H03H 7/09
[52] U.S. Cl. .................................... 333/175; 333/177; 333/181; 333/185
[58] Field of Search ...................... 333/167, 174–182, 333/184–185, 24 R, 132, 12

[56] References Cited

FOREIGN PATENT DOCUMENTS 287847 11/1928 United Kingdom ................. 333/177

OTHER PUBLICATIONS

Olsen—"RF Trapping Precision Analog Filter," IBM Technical Disclosure Bulletin, vol. 20, No. 4, Sep. 1977, p. 1342.

Primary Examiner—Marvin L. Nussbaum
Attorney, Agent, or Firm—Herbert L. Lerner; Laurence A. Greenberg

[57] ABSTRACT

Band-stop filter for equipment with carrier-frequency utilization of low-voltage lines, including a current-compensated choke having a closed ferrite core, two center taps, and two coil halves each of which having windings being connected to one of the center taps and wound with the same sense on the closed ferrite core, and a capacitor connected between the center taps.

9 Claims, 7 Drawing Figures

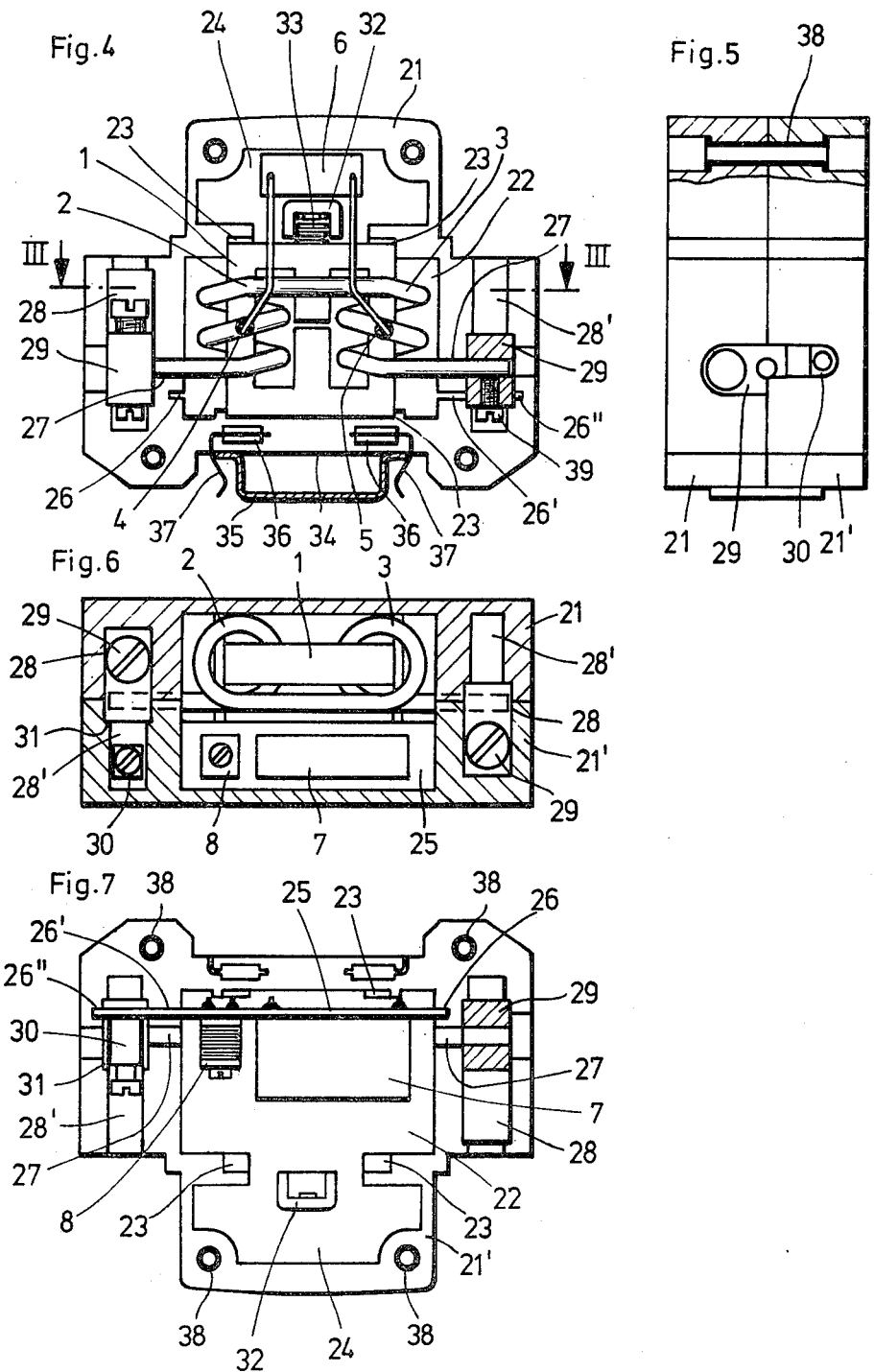

BAND-STOP FILTER FOR EQUIPMENT WITH CARRIER-FREQUENCY UTILIZATION OF LOW-VOLTAGE LINES

The invention relates to a band-stop filter for equipment with carrier-frequency utilization of low-voltage lines, including a current-compensating choke with two coil halves wound in the same direction or sense on a closed ferrite core.

In telecommunication systems which utilize the low-voltage lines of the house wiring network for transmitting signals, such as duplex telephone systems or signal or alarm systems, the problem arises that the high-frequency transmitting voltage transmitted through the low-voltage lines must not propagate beyond the internal installation network of a house or a dwelling. Although a certain amount of attenuation of the transmitting voltage is already obtained because of the line impedances of the wiring network and the series inductances of the preceding watt-hour meter, there is no absolute certainty, depending on the nature of the wiring network and the loads connected to this network, that the transmitting voltage will not transgress the internal installation. In these cases it is necessary to provide an additional attenuation member for blocking off the high-frequency transmitting voltage. Thus, band-stop filters of the hereinafore-described type which are manufactured by the firm VALVO, for instance, are known. These, however, are not suitable for the present application since they are usable only for relatively small currents because of their many coil windings.

If no voltage lines are used for the transmission of information or the like, it must be taken into consideration that a blocking filter that can be used as a band stop must be constructed in such a way that it passes-on the load currents which occur within the house installation without damage. The network currents which must be controlled may as a rule be in accordance with house fuses between 32 and 63 A. If a known alarm system, for instance "VICOM," which operates with a frequency of, for instance, 290 kHz and also utilizes the low-voltage wiring network of the house installation for transmitting signals is used, it is customary to use a current-compensate coil as a band-stop filter which is wound quadrofilarly and in which four coil windings for the three phases and the neutral conductor are accommodated on a ring core. This band-stop filter, which must be disposed behind the watt-hour meter of a house installation, requires a relatively greater space for the coil which must be encapsulated within a housing and must be connected in the watt-hour meter cabinet or in a terminal box ahead of the fuses of the individual circuits of a house installation. Besides the large overall volume, the wiring installation required therefor is also relatively expensive.

It is accordingly an object of the invention to provide a band-stop filter for equipment with carrier-frequency utilization of low-voltage lines which overcomes the hereinafore-mentioned disadvantages of the heretofore-known devices of this general type, and which is suitable for admitting large currents, has small dimensions and is easy to install in the watt-hour meter cabinet or the terminal box of a house installation.

With the foregoing and other objects in view there is provided, in accordance with the invention, a band-stop filter for equipment with carrier-frequency utilization of low-voltage lines, comprising a current-compensated choke having a closed ferrite core, two center taps, and two coil halves each of which having windings being connected to one of the center taps and wound with the same sense on the closed ferrite core, and a capacitor connected between the center taps.

The coil sections short-circuited by the capacitor therefore form, together with the capacitor, a parallel resonant circuit across which the high-frequency voltage can be formed. The high-frequency transmitting voltage produced within the wiring network of a house installation is thereby attenuated without difficulty, so that transmission beyond the internal installation network is impossible. At the same time, external signals which would interfere with the internal house-signalling installation cannot be transmitted into the internal network. In addition, only a few coil windings with a relatively heavy conductor cross section are required here. It is therefore made possible for the 50-Hz-load current to pass the carrier frequency block without being impeded and without the possibility of an undue temperature rise in the band-stop filter or deterioration of the attenuation due to saturation phenomena.

In accordance with another feature of the invention, the windings and capacitor are mutually tuned to a resonance frequency.

In accordance with a further feature of the invention, there is provided a network lead being connected to one of the windings and having a terminal, a neutral conductor, and a series resonant circuit including another capacitor and another coil and being connected between the terminal and the network conductor. In this way the high-frequency voltage on the watt-hour meter is short-circuited and the attenuation effect is additionally enhanced.

In accordance with an added feature of the invention, the other coil is variable or is a tuning coil whereby the tuning can be optimized to obtain the best attenuation values.

In accordance with an additional feature of the invention, there is provided a circuit board supporting the other capacitor, other coil and terminal, a housing having first and second identical shells with recesses and receptacles and the like for components, the first shell having a central recess and first supports formed therein for holding the choke, the second shell having lateral receptacles formed therein for holding the circuit board, the housing having pockets formed therein in the central recess and other terminals supported in the pockets, the housing having channels formed therein receiving ends of the choke winding and leading to the terminals, the housing having a further recess formed therein above the central recess for receiving the first-mentioned capacitor, a second support disposed in the housing, and a spring being biased against the second support and pressing the ferrite core onto the first support, the second support being disposed between the central recess and the further recess.

It is thereby possible to place part of the different components of the band-stop filter in one housing shell in spite of the uniform construction of the two housing shells, while the other parts of the components are accommodated in the recesses of the other housing shell. This makes a compact construction possible so that the band-stop filter can be installed in watt-hour meter cabinets or in terminal boxes with little space being required and being easy to install.

In accordance with yet another feature of the invention, there is provided a step disposed in at least one of the pockets for the terminals forming a relatively small chamber for the first-mentioned terminal of the series resonant circuit and a relatively large chamber for the other terminal of the core winding.

In accordance with yet a further feature of the invention, the step holds the winding terminal and series resonant circuit terminal fixed on the circuit board at a distance from each other. It is therefore possible to accommodate the terminals within the housing in a suitable and space-saving manner, whereby two terminals of different size can be accommodated side by side in the housing with the required leakage and air path.

In accordance with yet an added feature of the invention, the housing shells have an outer contour with a lower wider base region and a narrower housing part disposed above the base region for corresponding to the housing profile of protective line circuit breakers and similar equipment for installation on a standard profile bar and distributors, the pockets for the terminals being disposed laterally to the central recess, the pockets and the central recess being disposed side by side in the lower wider region, and the further recess being wider than the central recess and disposed in the narrower housing part.

In accordance with a concomitant feature of the invention, the housing has a bottom for resting on the standard profile bar, and there are provided additional supports disposed under the central recess between the central recess and the housing bottom, and clamping springs held by the additional supports for attachment to the standard profile bar.

The housing is accordingly constructed in such a way that the band-stop filter can be accommodated in watt-hour meter cabinets or sub-distribution boxes on standard profile bars, for instance according to DIN 46277, in conjunction with protective circuit breakers or other equipment.

Other features which are considered as characteristic for the invention are set forth in the appended claims.

Although the invention is illustrated and described herein as embodied in a band-stop filter for equipment with carrier-frequency utilization of low-voltage lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 4 is a diagrammatic elevational view; partly in section, of a housing shell with the components of the band-stop filter inserted therein;

FIG. 5 is a side elevational view partly broken away and in section, of the housing;

FIG. 6 is a cross-sectional view of FIG. 4, taken through the housing along the line III—III thereof in the direction of the arrows; and FIG. 7 is an elevational view of the other housing shell with the components disposed therein.

Figure 1:
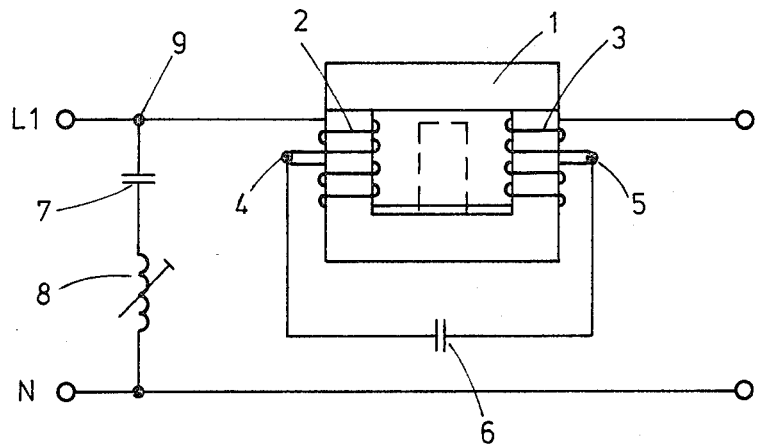
FIG. 1 is a schematic and diagrammatic representation of the construction of the band-stop filter of the invention.
Figure 2:
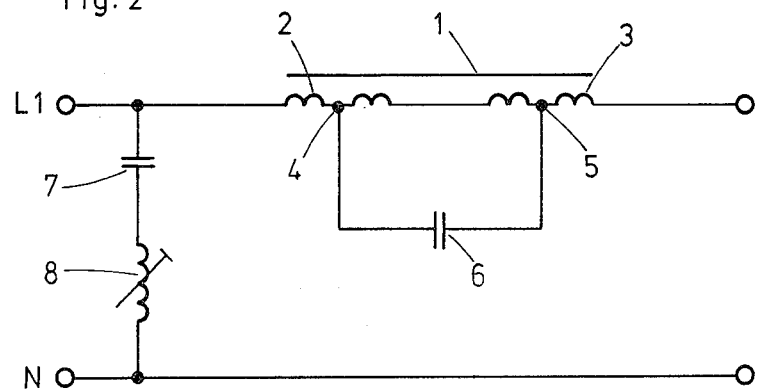
FIG. 2 is a circuit diagram of the band-stop filter.

Referring now to the figures of the drawing and first particularly to FIGS. 1 and 2 thereof, it is seen that two coils are wound with the same winding sense on a closed ferrite core 1 which may optionally be a toroidal core, a U-shaped or an E-shaped core. A current-compensated choke is therefore obtained in which the operating current flows through the windings in such a manner that the magnetic fields produced are parallel to each other and the magnetic flux is cancelled within the coil core. The coil windings 2 and 3 each have a center tap 4 and 5, respectively, to which a capacitor 6 is connected. The capacitor forms a parallel resonant circuit with the short-circuited parts of the coils 2 and 4, across which the high-frequency voltage drop can be formed. The windings 2 and 3 and the capacitor 6 are mutually tuned so that maximum attenuation is obtained, depending on the signal frequency to be transmitted. If the band-stop filter is used for attenuating a transmitting frequency of, say, 125 kHz, only four turns on each coil half are sufficient. A lead 9 of the coil winding on the network side is connected through a series resonant circuit including a capacitor 7 and a coil 8 to the center conductor N. For optimum tuning of the attenuation of the transmitting frequency to be obtained, the coil 8 is constructed as a variable coil.

Figure 3:
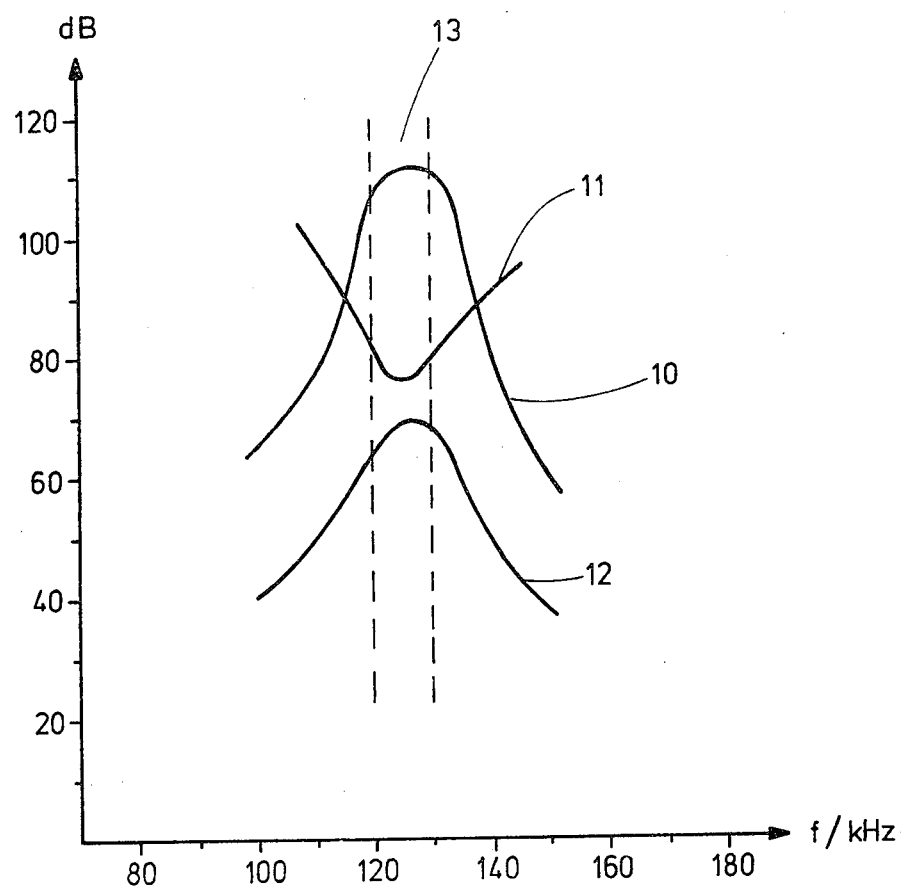
FIG. 3 is a graph of the high frequency voltage level.

In FIG. 3, the voltage levels of a signaling device used within a house wiring network and a voltage level obtained by the installation of the band-stop filter are shown in a coordinate system. In a duplex voice system which can have a maximum useful power of 5 mW according to post office regulations, this equipment is customarily operated within a bandwidth of, for instance, 125±4 kHz. This bandwidth is indicated in FIG. 3 with reference numeral 13. A curve 10 designates the transmitting level and a curve 11 designates the response threshold of such a system. Reference numeral 12 indicates the voltage level on the watt-hour meter side, taking the attenuations into consideration. As can be seen, a maximum transmitting level of 112 dB is obtained with a 50 ohm network simulation, which approximately represents a house wiring network. The receiving level of the signaling device is about 77 dB. The voltage level 12 obtained with the blocking filter according to the invention no longer corresponds to the receiving level 11, taking the attenuations within the house wiring network into consideration. Thus, the band-stop filter according to the invention perfectly prevents the high-frequency voltages of an internal wiring network from being spread beyond the area of this network. Additional attenuation by the series-connected watt-hour meter is not yet taken into account here.

The band-stop filter just described can be constructed so small that it can be accommodated within a housing which fits that of a protective circuit breaker or the like. Therefore, the band-stop filter can be easily installed inside a watt-hour meter cabinet or a distribution box on a support bar next to the line protection circuit breakers. Depending on whether one or more phase lines of a house wiring network must be used for transmitting signal frequencies, one, two or three band-stop filters are required in an installation. If several phase lines are used, additional phase couplers must be employed between them in a manner which is known per se. In the case of a band-stop filter according to the invention, it is not necessary, however, to bring the center conductor through the coil so that the installation is substantially simplified as compared to known devices.

In the embodiment example of a housing encapsulation shown in FIGS. 4 to 7, the housing shells 21 and 21' forming the housing are completely identical. Their interior has a central recess 22 with supports 23 and laterally formed-on receptacles 26 and channels 27. The current-compensated choke including the ferrite core 1 and the coil 2, 3 is inserted into the central recess 22 of one housing shell 21. The central recess 22 of the other housing shell 21' on the other hand receives the components of the series resonant circuit, and specifically the capacitor 7 and the coil 8. These are fastened on a circuit board 25 and electrically connected on one hand to a terminal 30, likewise fastened to the circuit board 25, while the other end of the series resonant circuit is connected to one end of the coil winding 2, 3. The circuit board 25 is inserted into receptacles 26, 26' and 26" which are formed in the housing shell 21, 21' laterally to the recess 22. Laterally to the central recess 22 are further formed pockets 28 and 28' in the housing shells 21, 21' for receiving the terminals 29 and 30.

The choke is connected at the free ends of its coil windings 2, 3 to the terminal 30, for instance by means of the screws 39. The assembly formed of the choke and the capacitor 6 connected to its coil windings 2, 3 at the center taps 4, 5 is inserted into the corresponding recesses and receptacles of the housing shell 21. The ferrite core 1 is inserted into the supports 23 within the central recess 22 and is held in these supports 23 by means of a compression spring 33 which is braced against a stationary support web 32 of the housing shells. The capacitor 6 is contained in a further recess 24 of the housing shell which is disposed above the central recess 22, and wherein the support 32 for the compression spring 33 is provided, between these recesses 22 and 24. The winding ends of the coil 2, 3 are received in the channels 27 which connect the central recess 22 to the pockets 28 and 28'. Into these pockets 28 and 28', the terminals 29 are inserted for connecting the power lines. After the series resonant circuit disposed on the circuit board 25 is inserted, the housing shells are put together and connected to each other by means of rivets or screws 38. The terminal provided for connecting the series resonant circuit to the center conductor is situated within a smaller chamber of the pocket 28' which is formed by a step 31. The terminal 29 of the choke comes to a stop on the step 31, so that it is held at a sufficient leakage and air path from the terminal 30 which is fixed on the circuit board 25. The circuit board 25 has a width which extends up to the step 31 so that it is reliably held in its position by the terminal 29 which bears on the step 31 and therefore on the circuit board 25. This mounting is further reinforced by making the length of the circuit board 25 so that it can be inserted into the receptacles 26 and 26" with a relatively close fit.

Under the central recess 22 and between the central recess and a mounting bottom 34 of the housing, supports 36 for receiving clamping springs 37 are further provided for fastening the housing on a standard profile bar 35.

There is claimed:

1. Band-stop filter for equipment with carrier-frequency utilization of low-voltage lines, comprising a current-compensated choke having two ends for direct connection to the main current loop of the low voltage lines, a ferromagnetic core, four coil windings being directly connected in series with each other forming a pair of front coils and a pair of rear coils, each pair being continuously wound in one direction, two of said coils being wound on said core producing opposing magnetic fields, two center taps each being connected between a respective one of said front and rear coil pairs, and a capacitor connected between said center taps.

2. Band-stop filter according to claim 1, wherein said windings and capacitor are mutually tuned to a resonance frequency.

3. Band-stop filter according to claim 1 or 2, including a network lead being connected to one of said windings and having a terminal, a neutral conductor, and a series resonant circuit including another capacitor and another coil and being connected between said terminal and said neutral conductor.

4. Band-stop filter according to claim 3, wherein said other coil is variable.

5. Band-stop filter according to claim 3, including a circuit board supporting said other capacitor, other coil and terminal, a housing having first and second identical shells, said first shell having a central recess and first supports formed therein for holding said choke, said second shell having lateral receptacles formed therein for holding said circuit board, said housing having pockets formed therein in said central recess and other terminals supported in said pockets, said housing having channels formed therein receiving ends of said choke winding and leading to said terminals, said housing having a further recess formed therein above said central recess for receiving said first-mentioned capacitor, a second support disposed in said housing, and a spring being biased against said second support and pressing said ferrite core onto said first support, said second support being disposed between said central recess and said further recess.

6. Band-stop filter according to claim 5, including a step disposed in at least one of said pockets forming a relatively small chamber for said first-mentioned terminal and a relatively large chamber for said other terminal.

7. Band-stop filter according to claim 6, wherein said step holds said terminals at a distance from each other.

8. Band-stop filter according to claim 5, wherein said housing shells have an outer contour with a lower wider base region and a narrower housing part disposed above said base region for corresponding to the housing profile of protective line circuit breakers and similar equipment for installation on a standard profile bar and distributors, said pockets being disposed laterally to said central recess, said pockets and said central recess being disposed side by side in said lower wider region, and said further recess being wider than said central recess and disposed in said narrower housing part.

9. Band-stop filter according to claim 8, wherein said housing has a bottom for resting on the standard profile bar, and including additional supports disposed under said central recess between said central recess and said housing bottom, and clamping springs held by said additional supports for attachment to the standard profile bar.

* * * * *